US011653473B2

(12) United States Patent
Wilson et al.

(10) Patent No.: US 11,653,473 B2
(45) Date of Patent: May 16, 2023

(54) INTEGRATED ELECTRICAL BUS BARS IN LIQUID COLDPLATE WITH HIGH DENSITY INTERCONNECTS

(71) Applicant: Raytheon Company, Waltham, MA (US)

(72) Inventors: James S. Wilson, Hurst, TX (US); Gordon R. Scott, Farmersville, TX (US); James M. Giesey, Richardson, TX (US)

(73) Assignee: Raytheon Company, Waltham, MA (US)

( * ) Notice: Subject to any disclaimer, the term of this patent is extended or adjusted under 35 U.S.C. 154(b) by 281 days.

(21) Appl. No.: 16/867,465

(22) Filed: May 5, 2020

(65) Prior Publication Data

US 2021/0352825 A1 Nov. 11, 2021

(51) Int. Cl.
*G06F 1/16* (2006.01)
*H05K 5/00* (2006.01)
*H05K 7/00* (2006.01)
*H05K 7/20* (2006.01)
*H05K 7/06* (2006.01)

(52) U.S. Cl.
CPC ........... *H05K 7/20254* (2013.01); *H05K 7/06* (2013.01); *H05K 7/20272* (2013.01)

(58) Field of Classification Search
CPC .. H05K 7/20254; H05K 7/06; H05K 7/20272; H05K 7/20281; H05K 7/20218; H05K 7/2029; G06F 1/20; G06F 1/203; G06F 1/206
See application file for complete search history.

(56) References Cited

U.S. PATENT DOCUMENTS

| | | | | |
|---|---|---|---|---|
| 4,589,057 A | * | 5/1986 | Short | H05K 7/20254 361/699 |
| 5,214,564 A | * | 5/1993 | Metzler | H01G 2/08 361/677 |
| 5,804,761 A | | 9/1998 | Donegan et al. | |
| 5,940,263 A | * | 8/1999 | Jakoubovitch | H01G 11/82 361/689 |
| 6,295,201 B1 | * | 9/2001 | Ogden | H01L 25/115 174/16.3 |

(Continued)

OTHER PUBLICATIONS

International Search Report dated May 6, 2021 in connection with International Patent Application No. PCT/US2021/013101, 3 pages.

(Continued)

*Primary Examiner* — Anthony M Haughton

(57) ABSTRACT

An apparatus includes a coldplate and a bus bar. The coldplate is configured to be thermally coupled to a structure to be cooled and to remove thermal energy from the structure. The bus bar is integrated into the coldplate and is configured to deliver power to multiple components of the structure. The apparatus may also include multiple mounting holes positioned in rows on the coldplate and configured to mechanically couple the structure to the coldplate, where one of the bus bar or an additional bus bar is integrated between each pair of adjacent rows of mounting holes. The apparatus may further include sealed cooling channels adjacent to the bus bar and each additional bus bar. The bus bar may be integrated into the coldplate using vacuum brazing or ultrasonic additive manufacturing.

20 Claims, 4 Drawing Sheets

(56) References Cited

U.S. PATENT DOCUMENTS

| | | | | |
|---|---|---|---|---|
| 6,574,094 B1* | 6/2003 | Morrow | ............... | F28D 5/00 |
| | | | | 361/699 |
| 6,757,175 B1* | 6/2004 | Bartley | ............ | H05K 7/1492 |
| | | | | 257/691 |
| 7,952,875 B2* | 5/2011 | Woody | ............ | H05K 7/20927 |
| | | | | 361/699 |
| 8,599,556 B2* | 12/2013 | Hentschel | ......... | H05K 7/20218 |
| | | | | 361/699 |
| 9,431,782 B2* | 8/2016 | Greenwood | ......... | H01R 13/46 |
| 9,853,435 B1* | 12/2017 | Burkman | ......... | H01M 50/502 |
| 2011/0235276 A1 | 9/2011 | Hentschel et al. | | |
| 2018/0261992 A1* | 9/2018 | Bower | ............... | H01B 3/306 |

OTHER PUBLICATIONS

Written Opinion of the International Searching Authority dated May 6, 2021 in connection with International Patent Application No. PCT/US2021/013101, 5 pages.

\* cited by examiner

INTEGRATED ELECTRICAL BUS BARS IN LIQUID COLDPLATE WITH HIGH DENSITY INTERCONNECTS

TECHNICAL FIELD

This disclosure is generally directed to thermal management systems. More specifically, this disclosure is directed to integrated electrical bus bars in a liquid coldplate with high density interconnects.

BACKGROUND

Thermal management systems are routinely used in electronic devices to remove heat from and thereby cool electronic components or other components in the devices. The ability to efficiently remove thermal energy from electronic devices may be necessary or desirable in a number of applications. For example, in applications that use high-power monolithic microwave integrated circuits (MMICs), insulated-gate bipolar transistors (IGBTs), field programmable gate arrays (FPGAs), systems in packages (SiPs), ball grid arrays (BGAs), or other high-power electronic components, it is often necessary to remove heat from the electronic components in order to ensure that the components operate properly and are not damaged by excessive temperatures. Routing potentially high currents to distributed electronics that are operated in a pulsed manner requires a low resistive and inductance path to avoid excessive voltage variation. Surrounding the busbar with the coldplate which serves as an electrical return path enables this low inductance characteristic as well as providing EMI shielding.

SUMMARY

This disclosure relates to integrated electrical bus bars in liquid coldplate with high density interconnects.

In a first embodiment, an apparatus includes a coldplate and a bus bar. The coldplate is configured to be thermally coupled to a structure to be cooled and to remove thermal energy from the structure. The bus bar is integrated into the coldplate and is configured to deliver power to multiple components of the structure.

In a second embodiment, a system includes an electronic device and a cooling apparatus. The electronic device includes a substrate and multiple electronic components in or on the substrate. The cooling apparatus includes a coldplate and a bus bar. The coldplate is configured to be thermally coupled to the substrate and to remove thermal energy from the substrate. The bus bar is integrated into the coldplate and is configured to deliver power to the electronic components of the electronic device.

In a third embodiment, a method includes integrating a bus bar into a coldplate. The method also includes thermally coupling the coldplate to a structure to be cooled, where the coldplate is configured to remove thermal energy from the structure. The method further includes electrically coupling multiple components of the structure to the bus bar, where the bus bar is configured to deliver electrical power to the multiple components of the structure.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
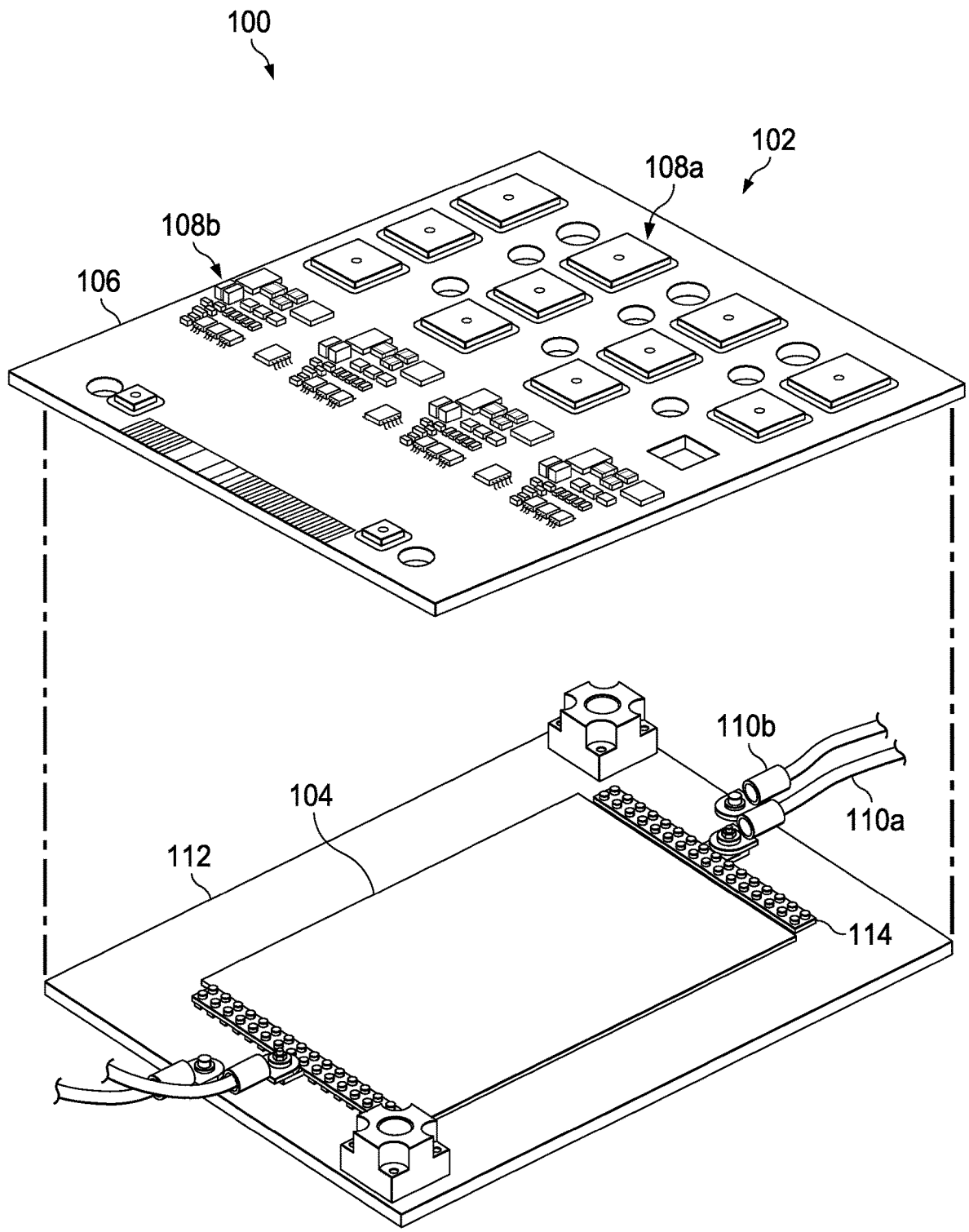
FIG. 1 illustrates an example device using one or more integrated electrical bus bars in a liquid coldplate with high density interconnects according to this disclosure.
Figure 2A:
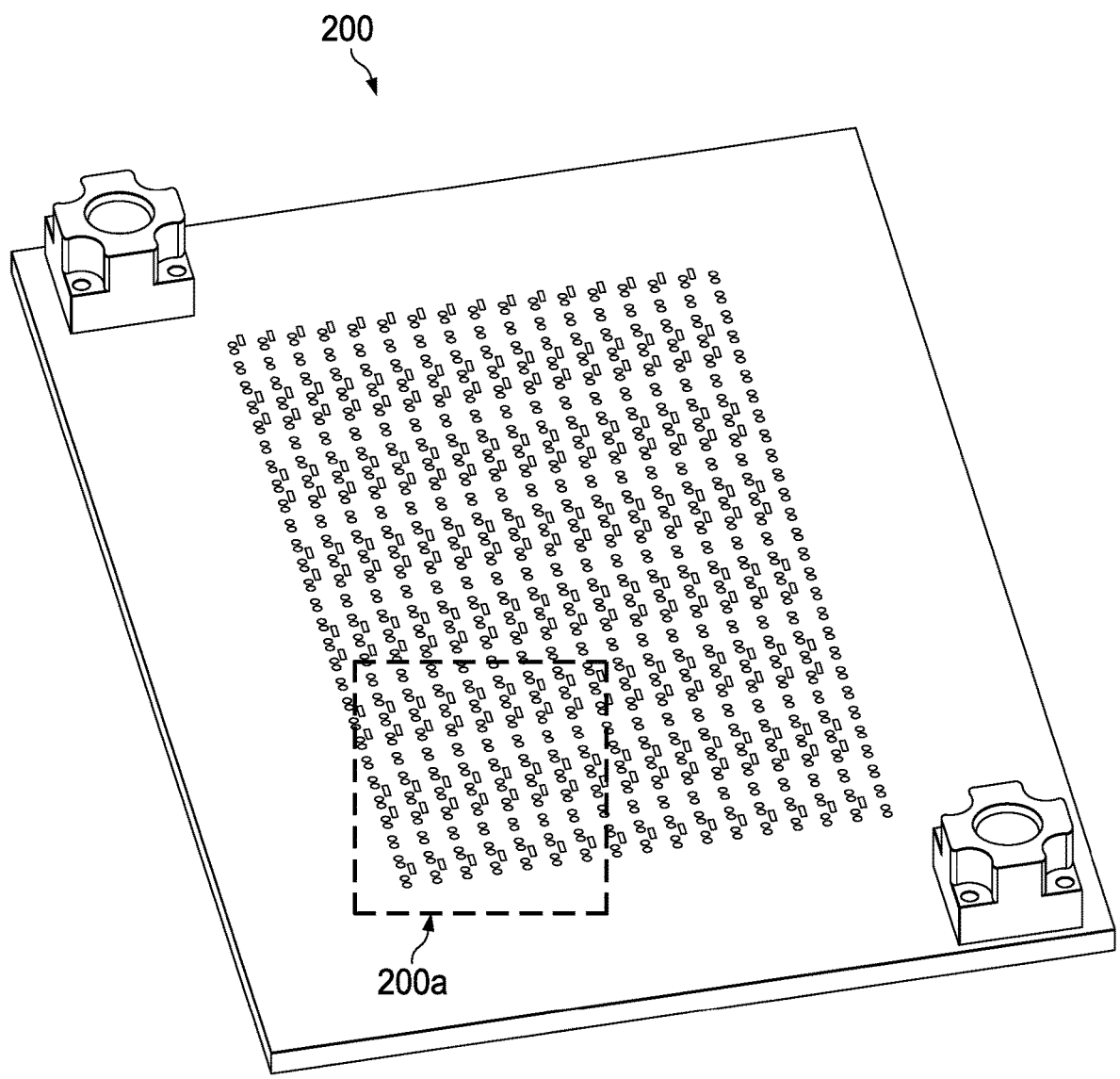
FIGS. 2A through 2C illustrate an example liquid coldplate having one or more integrated electrical bus bars with high density interconnects according to this disclosure.
Figure 2B:
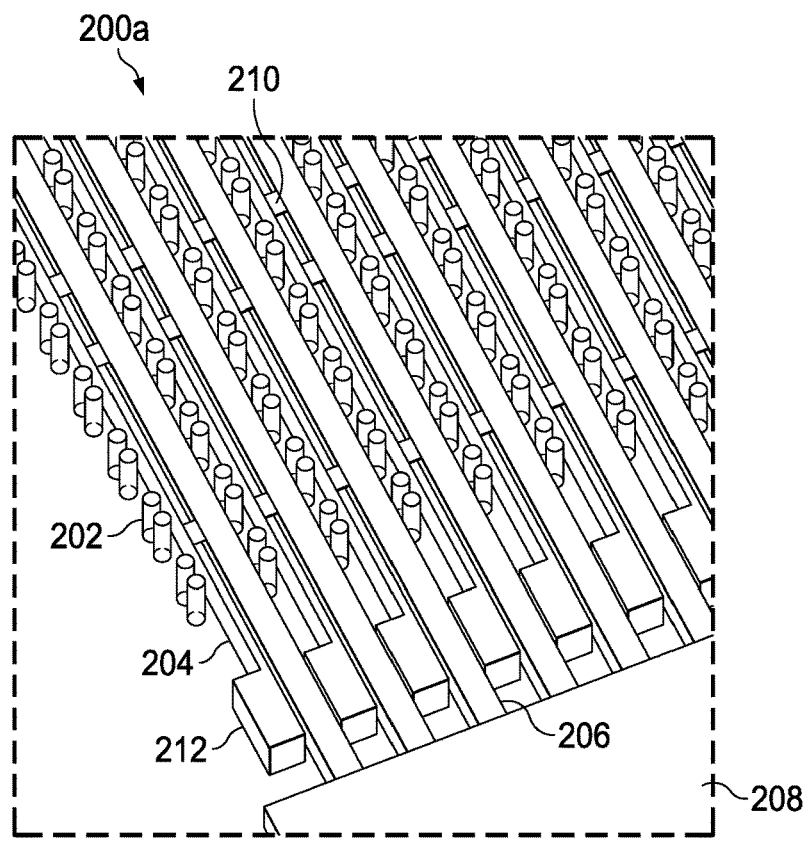
Figure 2C:
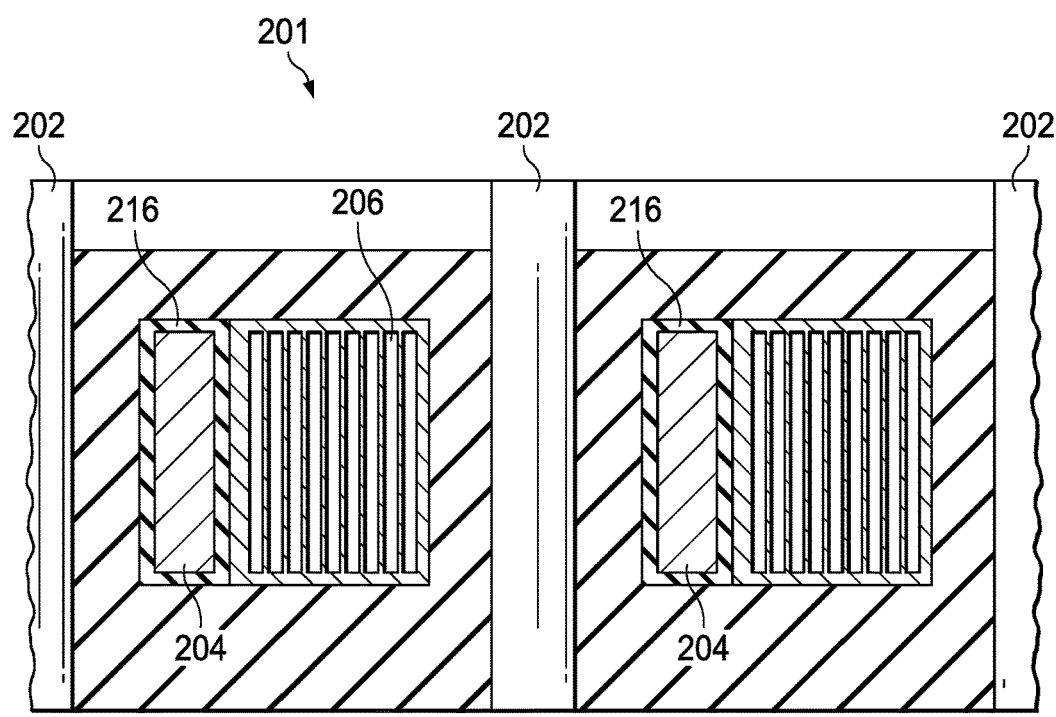
Figure 3:
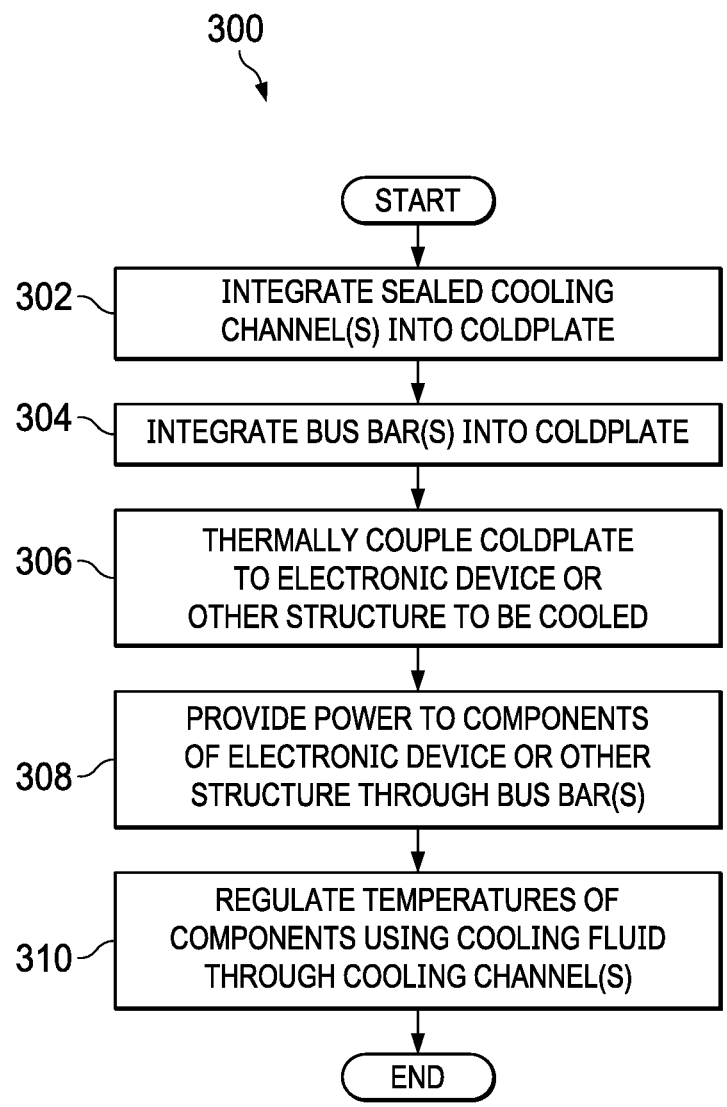
FIG. 3 illustrates an example method for integrating one or more electrical bus bars in a liquid coldplate with high density interconnects according to this disclosure.

FIGS. 1 through 3, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, thermal management systems are routinely used in electronic devices to remove heat from and thereby cool electronic components or other components in the devices. For example, in applications that use high-power monolithic microwave integrated circuits (MMICs), insulated-gate bipolar transistors (IGBTs), field programmable gate arrays (FPGAs), system in package (SiP), ball grid arrays (BGAs), or other high-power electronic components, it is often necessary to remove heat from the electronic components in order to ensure that the components operate properly and are not damaged by excessive temperatures. These electronics may operate in a pulsed manner requiring current that varies with time and require that the associated voltage only vary within prescribed bounds.

One common technique used to cool MMICs, IGBTs, FPGAs, SiPs, BGAs, or other electronic components involves mounting a circuit board, circuit card, or other substrate carrying the electronic components on a base that functions as a thermal spreader (also called a coldplate), meaning the base receives thermal energy from the electronic components and spreads the thermal energy over a large area. The thermal energy can then be removed from the thermal spreader more easily. As a particular example, a circuit board, circuit card, or other substrate carrying electronic components may be mounted on a solid copper base or other solid metal base. Unfortunately, these types of thermal spreaders are often heavy and can be relatively expensive. The weight of the thermal spreaders may be particularly problematic in weight-sensitive devices or systems, especially when numerous thermal spreaders are used to help cool a large number of electronic components. In some cases, integrating a cooling channel for fluid into a thermal spreader increases its cooling capacity by allowing the fluid to more quickly and efficiently remove excess heat energy.

Moreover, it may be necessary or desirable to reduce the size as well as the weight of an overall assembly. Using different components for a thermal spreader and a bus bar assembly (which may be used to provide power) increases both the size and the weight of the overall assembly. Integrating a cooling channel into a bus bar assembly can decrease an amount of volume necessary for cooling, which allows for (among other things) insertion of bus bars between connection components. Combining a bus bar assembly and a thermal spreader into a single component could therefore drastically reduce size and weight of the overall assembly.

Arrays of panels can present interconnect difficulties with respect to bus bars, particularly as component sizes continue to decrease and interconnect quantities continue to increase. To reduce the need to perforate all of the panels for power pass-through, an electrical bus bar can be integrated inside a thermal spreader adjacent to one or more fluid channels. This approach for packaging provides more efficient usage of available space and provides a low-inductance circuit if a return voltage rail is carried through a metal thermal spreader. The lower inductance will also reduce the total capacitance need and improve the overall packaging efficiency. A non-conductive coating applied to the integrated bus bars can help to ensure isolation between conductive parts.

This disclosure therefore provides various techniques for integrating one or more electrical bus bars in a liquid coldplate with high density interconnects. As described in more detail below, a thermal spreader or coldplate is integrated with one or more electrical bus bars that include high density interconnects, which allows the reduction of components and overall weight in an assembly. For instance, a thermal spreader may have reduced-size cooling channels in order to include an electrical bus bar within the space, which allows the previous volume encompassed by the cooling channel to now include a cooling channel and an electrical bus bar.

FIG. 1 illustrates an example device 100 using one or more integrated electrical bus bars in a liquid coldplate with high density interconnects according to this disclosure. As shown in FIG. 1, the device 100 generally includes a circuit card assembly 102 and a thermal spreader or coldplate 104. The circuit card assembly 102 generally includes one or more electronic components or other components that are cooled by removing thermal energy from the circuit card assembly 102 using the coldplate 104. Note, however, that the coldplate 104 may be used to cool any other suitable component or components.

In the example shown in FIG. 1, the circuit card assembly 102 includes a circuit board, circuit card, or other substrate 106, which is used to carry various electronic components 108a-108b and electrical connections between or involving the electronic components 108a-108b. The substrate 106 represents any suitable structure in or on which electrical components and electrical pathways can be formed or placed. For example, the substrate 106 may represent a rigid printed circuit board, a flexible circuit board, or any other suitable structure used to carry electrical components and conductive traces or other conductive pathways. The substrate 106 may be formed from any suitable material(s), such as cotton paper, woven fiberglass, or woven glass and epoxy resin, carbon, metal, alumina or other ceramic, or polytetrafluoroethylene, polyimide, polyester, or other polymer. Also, the substrate 106 may be formed in any suitable manner, such as by using a single layer of material or by using multiple layers of material that are laminated or otherwise joined together. In addition, the substrate 106 may have any suitable size, shape, and dimensions. As a particular example, the substrate 106 may have a square shape with sides that are about 5 inches (about 12.7 centimeters) in length.

The substrate 106 may be used to carry any suitable number(s) and type(s) of electronic components 108a-108b. In this example, the electronic components are generally divided into higher-power or higher-temperature electronic components 108a and lower-power or lower-temperature electronic components 108b. The electronic components 108a generally represent semiconductor chips, integrated circuits, or other components that operate using larger amounts of electrical power or that otherwise generate larger amounts of thermal energy to be removed from the device 100 (relative to the electronic components 108b). As a particular example, the electronic components 108a may include one or more MIMIC chips, IGBTs, FPGAs, SiPs, BGAs, or other high-power or high-performance electronic components. The electronic components 108b generally represent semiconductor chips, integrated circuits, or other components that operate using smaller amounts of electrical power or that otherwise generate smaller amounts of thermal energy to be removed from the device 100 (relative to the electronic components 108a). As a particular example, the electronic components 108b may include one or more passive or active electrical components, such as those that consume less power than MMICs, IGBTs, FPGAs, SiPs, and BGAs.

Note that the division of the electronic components into the electronic components 108a and the electronic components 108b is for illustration only. Any number of electronic components 108a and any number of electronic components 108b may be used in the device 100, and the electronic components 108a-108b may have any suitable arrangement on the substrate 106. Also note that the electronic components in the device 100 may be divided into more than two groups.

The substrate 106 may also be coupled to one or more additional components. In this example, the substrate 106 may be coupled to various antennas, all of which are coupled to and extend from one side of the substrate 106 in this particular embodiment (although the antennas may be coupled to the substrate 106 in any other suitable manner). Each antenna may be electrically coupled to at least one electronic component 108a-108b, such as one or more MMICs, IGBTs, FPGAs, SiPs, BGAs, or other electronic components. Note, however, that any other or additional components may be coupled to the substrate 106 or to the electronic components 108a-108b carried by the substrate 106, or the device 100 may include no other components coupled to the substrate 106.

The coldplate 104 includes electrical connections 110. The electrical connections supply electrical power to the components 108a-108b of the device 100 through one or more electrical bus bars in the coldplate 104 as described below. The electrical connections 110a-110b can include a supply connection 110a and a ground connection 110b. The supply connection 110a is connected to a current pad 114, and the ground connection 110b is connected to a current pad 114 at the opposite end of the coldplate 104. The electrical connections 110a-110b can be attached to a side single of the coldplate 104 or to multiple sides of the coldplate 104 as shown in FIG. 1. The current pads 114 can supply electrical power through the one or more electrical bus bars in various ways, including those described below.

The base 112 of the coldplate 104 is connected (at least thermally) to the circuit card assembly 102 and removes thermal energy from the circuit card assembly 102. The base 112 of the coldplate 104 can also be coupled to another device or system that removes thermal energy from the coldplate 104. Thermal energy can be removed from the base 112 in any suitable manner, such as via conduction, convection, or radiation. The base 112 may have any suitable size, shape, and dimensions. As a particular example, the base 112 may have a square shape with sides that are about 5 inches (about 12.7 centimeters) in length, and the base 112 may have a thickness of about 0.1 inches (about 2.54 millimeters). In some instances, the base 112 generally has the same size and shape as the substrate 106, although this need not be the case. The coldplate 104 may be attached to the circuit card assembly 102 in any suitable manner. For example, the base 112 of the coldplate 104 may be attached to the substrate 106 of the circuit card assembly 102 using bolts, screws or other connectors, a thermally conductive adhesive, bonding through a process such as lamination, or attached to the circuit card assembly 102 in any other suitable manner.

The coldplate 104 may be formed from any suitable materials, such as aluminum silicon carbide or thermal pyrolytic graphite and aluminum or aluminum alloy. Also, the coldplate 104 may be fabricated in any suitable manner. For instance, the coldplate 104 may be fabricated as a multi-layer structure in which (i) outer layers are formed from a material (such as aluminum or aluminum alloy) and (ii) an inner layer is partially formed from the same material as the outer layers and partially formed from an additional material (such as aluminum silicon carbide or thermal pyrolytic graphite). As a particular example, a structure containing aluminum silicon carbide or thermal pyrolytic graphite may be fabricated with holes, and aluminum or aluminum alloy layers may be formed around the aluminum silicon carbide or thermal pyrolytic graphite and through the holes. Among other things, fabricating the coldplate 104 using multiple layers may allow the fabrication process to use standard processing techniques. However, the coldplate 104 may be fabricated in any other suitable manner. Compared to conventional solid metal coldplates, the coldplate 104 can achieve significant weight reductions while providing power to components 108a-108b on the substrate 106.

Although FIG. 1 illustrates one example of a device 100 using one or more integrated electrical bus bars in a liquid coldplate with high density interconnects, various changes may be made to FIG. 1. For example, a coldplate 104 having one or more integrated electrical bus bars with high density interconnects may be used in any other suitable device or system. Also, the geometry of the coldplate 104 can vary in a number of ways, including based on the expected electrical connections of a structure to be cooled and powered.

FIGS. 2A through 2C illustrate an example liquid coldplate 200 having one or more integrated electrical bus bars with high density interconnects according to this disclosure. The coldplate 200 may, for example, represent one possible implementation of the coldplate 104 in the device 100 of FIG. 1. However, the coldplate 200 may be used in any other suitable device or system. FIG. 2B is a magnified view of a section 200a of the coldplate 200, and FIG. 2C illustrates an example cross section 201 of the coldplate 200.

As shown in FIGS. 2A through 2C, the coldplate 200 includes a plurality of mounting holes 202, a plurality of electric bus bars 204, a plurality of cooling channels 206, and a coolant distributor 208 at each end of the coldplate 200. The coldplate 200 here provides reduced structure by implementing a bus bar 204 with each cooling channel 206 between adjacent rows of mounting holes 202.

The mounting holes 202 are distributed along a face of the coldplate 200 to allow for point-of-use power and to enable distribution capacitance at the load. For example, the mounting holes 202 may be distributed across the coldplate 200 in a manner to mechanically connect to various electronic components 108a-108b or to otherwise connect to a structure to be cooled. The mounting holes 202 can be generally patterned as illustrated in FIG. 2A, although this is for illustration only. The mounting holes 202 may be patterned in any other suitable manner, such as based on connecting the coldplate 200 to a specific substrate 106.

In certain embodiments, a second circuit card assembly 102 can be attached to an opposite side of the coldplate 200 from the first circuit card assembly 102. In these embodiments, the mounting holes 202 can provide further interconnectivity between the first circuit card assembly 102 and the second circuit card assembly 102. The mounting holes 202 can be used to transmit messages between components of the circuit card assemblies.

The integration of at least one bus bar 204 into a liquid coldplate 200 can be achieved through various manufacturing techniques, including through traditional vacuum brazing and ultrasonic additive manufacturing techniques. In some cases, the vacuum brazing technique may use insulation 216 around the bus bars that can survive high temperatures, whereas the ultrasonic additive manufacturing technique may incorporate lower temperature insulation 216.

A typical coldplate 200 has a cross-sectional area to provide sufficient cooling benefits for a specific application. In order to accommodate an electrical bus bar 204 in the cross-sectional area between mounting holes 202, a sealed cooling channel 206 is integrated into the coldplate 200. Each sealed cooling channel 206 is used to transport cooling liquid (which can be received from and provided to the coolant distributors 208 at opposite sides of the coldplate 200) in order provide greater cooling capacity than the solid material of the coldplate 200. Each sealed cooling channel 206 can be moved closer to the mounting holes 202 for additional volume recovery for the electrical bus bar 204 if needed or desired.

Each sealed cooling channel 206 is connected and exposed at both ends to the coolant distributor 208. Each cooling channel 206 is also sealed from leaking cooling liquid onto the electric bus bar 204. The cooling liquid can be inserted into the coolant distributor 208 at one end of the coldplate 200 and travel through the cooling channel(s) 206 to the coolant distributor 208 at the other end of the coldplate 200. The cooling liquid removes heat from the coldplate 200 in order to facilitate cooling of a structure. Each cooling channel 206 can be fabricated to have any suitable shape and in any suitable manner.

Each electric bus bar 204 is implemented in the coldplate 200 between adjacent rows of mounting holes 202. A substantial array-level benefit can include reduced overall assembly thickness, since a separate thickness allocation for bus bar routing is not required. Each electric bus bar 204 can be electrically connected to multiple components of a structure to be cooled, such as to multiple electronic components 108a-108b. In this example, each electric bus bar 204 includes a plurality of exposed power interconnects 210. Each power interconnect 210 is positioned for electrically connecting the associated bus bar 204 to multiple components of a structure to be cooled. The spacing of the power interconnects 210 can be generally consistent or based on a design of the structure to be cooled. Each electric bus bar 204 also includes an exposed power interconnect 212 at each end for connecting to the current pad 114, supply connection 110a, or ground connection 110b.

During operation, electrical power can be supplied to the structure being cooled through the bus bars 204 and their power interconnects 210, while cooling fluid travels through the cooling channels 206. This allows the coldplate 200 to both supply electrical power to the structure being cooled while removing thermal energy from the structure being cooled. Moreover, these functions can be accomplished using a more compact and light-weight coldplate compared to conventional approaches.

Although FIGS. 2A through 2C illustrate one example of a liquid coldplate 200 having one or more integrated electrical bus bars with high density interconnects, various changes may be made to FIGS. 2A through 2C. For example, each individual component of the coldplate 200 may have any suitable size, shape, and dimensions, and coldplate 200 overall may have any suitable size, shape, and dimensions. Also, while specific materials may be described above as being used in the coldplate 200, the coldplate 200 may be fabricated from any other suitable materials. In addition, the coldplate 200 may include any suitable number of each component shown here.

FIG. 3 illustrates an example method 300 for integrating one or more electrical bus bars in a liquid coldplate with high density interconnects according to this disclosure. For ease of explanation, the method 300 shown in FIG. 3 may be described as involving the coldplate 200 of FIGS. 2A through 2C, which may be designed for use in or with the device 100 of FIG. 1. However, the method 300 shown in FIG. 3 may involve the use of any suitable coldplate with any suitable device or system.

As shown in FIG. 3, at least one sealed cooling channel 206 is integrated into a coldplate 200 at step 302. This may include, for example, using the design of an electronic device 100, simulation tools, or any other suitable approaches to determine amounts and dimensions of one or more sealed cooling channels 206 to be implemented into the coldplate 200. As a particular example, this may include implementing each sealed cooling channel 200 to reduce a volume required for regulating a temperature of component 108a-108b of an electronic device 100. In some embodiments, multiple sealed cooling channels 206 can be integrated in the coldplate 200 with a coolant distributor 208 at each end. The coolant distributor 208 can receive coolant from an external source, distribute the cooling fluid to each of the cooling channels 206, receive the cooling fluid from each of the cooling channels 206, and provide the cooling fluid to an external destination.

At least one bus bar 204 is integrated into the coldplate 200 at step 304. This may include, for example, integrating one or multiple bus bars 204 into the coldplate 200. In some embodiments, the coldplate 200 can include mounting holes 202 arranged in multiple rows, and a bus bar 204 and a cooling channel 206 can be integrated between each pair of adjacent rows of mounting holes 202. In some cases, the cross-sectional areas of the bus bars 204 and the cooling channels 206 can be determined based on the types of components that the coldplate 200 is designed to cool. Each bus bar 204 can be connected to current pads 114, and the current pads 114 in combination can provide or distribute power through each of the bus bars 204. Each bus bar 204 can include power interconnects 210, 212. The power interconnects 210 are spaced along each bus bar 204 to connect with and provide power to multiple components of the structure to be cooled, such as the components 108a, 108b. The power interconnects 212 are exposed at each end of the bus bars 204 and are meant to connect to a power source, such as via the current pads 114. The bus bars 204 and power interconnects 212 are fully insulated from the cold plate 200, which can function as a conduit to the ground 110b. The power interconnects 212 being surrounded by the coldplate and separated by a thin layer of insulation provides for a low-inductance connection method between the coldplate 200 and the electrical device.

The coldplate 200 can be thermally coupled to an electronic device or other structure to be cooled at step 306. This may include, for example, thermally and mechanically coupling the coldplate 200 and the device 100 so that the components 108a, 108b or their electrical connections on the substrate 106 align with the power interconnects 210 of the bus bars 204. The coldplate 200 may be couple to the structure to be cooled in any suitable manner, such as by using those techniques described above.

Power can be provided to the various component 108a-108b of the electronic device or other structure through the bus bars 204 at step 308. This may include, for example, distributing common or different amounts of current to the bus bars 204 based on the designed current requirements of the various components 108a, 108b. For instance, the current pads 114 can be designed to evenly or unevenly distribute power through the bus bars 204.

Temperatures of the various components can be regulated using a cooling fluid through the cooling channels 206 at step 310. This may include, for example, distributing common or different amounts of cooling fluid through the cooling channels 206. The coolant distributor 208 can be designed to evenly or unevenly distribute the cooling fluid to the cooling channels 206, such as based on amounts of heat expected to be generated by the various components 108a, 108b.

Although FIG. 3 illustrates one example of a method 300 for integrating one or more electrical bus bars in a liquid coldplate with high density interconnects, various changes may be made to FIG. 3. For example, while shown as a series of steps, various steps in FIG. 3 may overlap, occur in parallel, occur in a different order, or occur any number of times. As a particular example, multiple instances of the designed coldplate may be fabricated for multiple instances of the structure to be cooled at the same time. Also, the bus bar(s) 204 and cooling channel(s) 206 may be formed in the coldplate 200 in any suitable manner.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a coldplate configured to be thermally coupled to a structure to be cooled and to remove thermal energy from the structure;
   multiple bus bars embedded within the coldplate and configured to deliver power to multiple components of the structure; and
   multiple mounting holes positioned in rows on the coldplate and configured to mechanically couple the structure to the coldplate, wherein the rows of the mounting holes are positioned between adjacent pairs of the bus bars.

2. The apparatus of claim 1, further comprising:
   a sealed cooling channel embedded within the coldplate adjacent to the bus bars.

3. The apparatus of claim 1, wherein one of the bus bars is embedded within the coldplate between each pair of adjacent rows of mounting holes.

4. The apparatus of claim 3, further comprising:
   sealed cooling channels adjacent to the bus bars.

5. The apparatus of claim 1, further comprising:
   a current pad integrated in the coldplate at one end of the bus bars;
   wherein the current pad is configured to enable distribution of current to the multiple components of the structure through the bus bars.

6. The apparatus of claim 1, wherein the bus bars are embedded within the coldplate using vacuum brazing or ultrasonic additive manufacturing.

7. The apparatus of claim 1, further comprising:
   an insulation completely insulating the bus bars from the coldplate.

8. A system comprising:
   an electronic device comprising a substrate and multiple electronic components in or on the substrate; and
   a cooling apparatus comprising:
     a coldplate configured to be thermally coupled to the substrate and to remove thermal energy from the substrate;
     multiple bus bars embedded within the coldplate and configured to deliver power to the electronic components of the electronic device; and
     multiple mounting holes positioned in rows on the coldplate and configured to mechanically couple the cooling apparatus to the electronic device, wherein the rows of the mounting holes are positioned between adjacent pairs of the bus bars.

9. The system of claim 8, wherein the cooling apparatus further comprises a sealed cooling channel embedded within the coldplate adjacent to the bus bars.

10. The system of claim 8, wherein one of the bus bars is embedded within the coldplate between each pair of adjacent rows of mounting holes.

11. The system of claim 10, wherein the cooling apparatus further comprises sealed cooling channels adjacent to the bus bars.

12. The system of claim 8, wherein:
    the cooling apparatus further comprises a current pad integrated in the coldplate at one end of the bus bars; and
    the current pad is configured to enable distribution of current to the multiple electronic components of the electronic device through the bus bars.

13. The system of claim 8, wherein the bus bars are embedded within the coldplate using vacuum brazing or ultrasonic additive manufacturing.

14. The system of claim 8, wherein the cooling apparatus further comprises an insulation completely insulating the bus bars from the coldplate.

15. A method comprising:
    embedding multiple bus bars within a coldplate;
    forming multiple mounting holes positioned in rows on the coldplate and configured to mechanically couple a structure to be cooled to the coldplate, wherein the rows of the mounting holes are positioned between adjacent pairs of the bus bars;
    thermally coupling the coldplate to the structure, the coldplate configured to remove thermal energy from the structure; and
    electrically coupling multiple components of the structure to the bus bars, the bus bars configured to deliver electrical power to the multiple components of the structure.

16. The method of claim 15, further comprising:
    embedding a sealed cooling channel within the coldplate adjacent to the bus bars.

17. The method of claim 15,
    wherein one of the bus bars is embedded within the coldplate between each pair of adjacent rows of mounting holes.

18. The method of claim 15, further comprising:
    forming a current pad integrated in the coldplate on one side of the bus bars;
    wherein the current pad is configured to enable distribution of current to the multiple components of the structure through the bus bars.

19. The method of claim 15, wherein the bus bars are embedded within the coldplate using vacuum brazing or ultrasonic additive manufacturing.

20. The method of claim 15, further comprising:
    completely insulating the bus bars from the coldplate with an insulation.

* * * * *